(12) United States Patent
Tai et al.

(10) Patent No.: US 6,709,604 B2
(45) Date of Patent: Mar. 23, 2004

(54) PARYLENE MICRO CHECK VALVE AND FABRICATION METHOD THEREOF

(75) Inventors: Yu-Chong Tai, Pasadena, CA (US); Xuan-Qi Wang, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 227 days.

(21) Appl. No.: 09/792,752

(22) Filed: Feb. 22, 2001

(65) Prior Publication Data

US 2001/0019034 A1 Sep. 6, 2001

Related U.S. Application Data

(62) Division of application No. 09/442,076, filed on Nov. 16, 1999, now Pat. No. 6,240,962.
(60) Provisional application No. 60/108,681, filed on Nov. 16, 1998, and provisional application No. 60/114,959, filed on Jan. 5, 1999.

(51) Int. Cl.[7] .................................................. C23F 1/00

(52) U.S. Cl. ................. 216/2; 216/8; 216/11; 216/137; 216/852; 216/859; 216/251; 216/368
(58) Field of Search .................... 216/2, 8, 11; 137/852, 137/859; 251/368

(56) References Cited

U.S. PATENT DOCUMENTS

| | | | |
|---|---|---|---|
| 3,307,819 A | | 3/1967 | Cocito |
| 3,608,676 A | | 9/1971 | Wieck |
| 4,869,282 A | * | 9/1989 | Sittler et al. .............. 137/15.01 |
| 5,116,457 A | * | 5/1992 | Jerman ........................ 438/53 |
| 5,171,606 A | * | 12/1992 | Mayer et al. ................ 427/162 |
| 5,199,685 A | | 4/1993 | Larseneur |
| 5,265,415 A | | 11/1993 | Cox, Jr. |
| 5,727,594 A | * | 3/1998 | Choksi ........................ 137/859 |
| 5,839,467 A | | 11/1998 | Saaski et al. |
| 6,069,392 A | * | 5/2000 | Tai et al. .................... 257/419 |
| 6,126,273 A | * | 10/2000 | Van Vooren et al. ......... 347/54 |
| 6,136,212 A | * | 10/2000 | Mastrangelo et al. ......... 216/49 |
| 6,146,543 A | * | 11/2000 | Tai et al. ........................ 216/2 |
| 6,241,904 B1 | * | 6/2001 | Silverbrook ................. 216/27 |

* cited by examiner

Primary Examiner—Robert Kunemund
Assistant Examiner—Shamim Ahmed
(74) Attorney, Agent, or Firm—Fish & Richardson P.C.

(57) ABSTRACT

The present disclosure describes a Parylene micro check valve including a micromachined silicon valve seat with a roughened top surface to which a membrane cap is anchored by twist-up tethers. The micro check valve is found to exhibit low cracking pressure, high reverse pressure, low reverse flow leakage, and negligible membrane-induced flow resistance when used as a valve over a micro orifice through which flow liquid and gas fluids.

10 Claims, 6 Drawing Sheets

PARYLENE MICRO CHECK VALVE AND FABRICATION METHOD THEREOF

CROSS REFERENCE TO RELATED APPLICATIONS

This is a divisional of U.S. application Ser. No. 09/442,076, filed Nov. 16, 1999, now U.S. Pat. No. 6,240,962.

This application claims the benefit of U.S. Provisional Application No. 60/114,959, filed on Jan. 5, 1999, and U.S. Provisional Application No. 60/108,681, filed on Nov. 16, 1998.

STATEMENT AS TO FEDERALLY SPONSORED RESEARCH

The U.S. Government has certain rights in this invention pursuant to a Grant No. N66001-96-C-8632 awarded by DARP/ETO.

FIELD OF THE INVENTION

This disclosure relates to check valves, and more particularly, to check valves of the type having a deflectable membrane which is self-actuated when subject to forward fluid flow and closed when subject to a backward flow.

BACKGROUND

Check valves are passive devices that, by virtue of a deflectable element which functions as a diaphragm, open and close based on fluid flow direction, pressure and force therethrough. Such check valves are particularly useful in microfluidic systems, such as micro pumps, for directing fluid flow.

Ring mesas, cantilevers, and membranes fabricated from silicon, silicone, polyimide and metal have been used to form a deflectable valving element in check valves. In every micro-check-valve configuration, there is a valve seat and an orifice that is formed therein. The valve seat is often made of potassium hydroxide (KOH)—etched trapezoidal structures on a silicon substrate. Many check valves use a two-piece bonded construction that requires greater packaging labor. A two-piece bonded construction, however, is characterized by higher withstand forward and backward fluid working pressures.

A micro check valve configuration must generally satisfy performance criteria established by the designer. A number of criteria go into selecting and sizing a micro check valve. It is important to avoid excessive flow resistance which could lead to large pressure losses due to the micron-size property of the fluid directing orifice and the limited fluid passage property of the small gap between the deflectable valving element and the valve seat often.

In addition, the inherently small size of a micro valve attributes to stiction and surface tension effects between the valve seat and deflectable valving element. Cracking pressure, the minimum pressure to open a check valve during forward fluid flow, is commonly used to gauge the stiction effect. A micro check valve should have low cracking pressure, low membrane-induced flow resistance, small reverse leakage and large operational reverse pressure characteristics. Ideally, a single chip construction is also preferable to enjoy the benefits of reduced packaging demands.

SUMMARY

The present disclosure describes a Parylene micro check valve and fabrication process therefore. The check valve includes a valve seat with a preferably roughened top surface to which a membrane cap is anchored by circumferentially-orientated twist-up tethers.

The micro check valve is found to exhibit low cracking pressure, high reverse pressure, low reverse flow leakage, and negligible membrane-induced flow resistance characteristics when used as a valve over a micro orifice through which flow liquid and gas fluids.

The invention takes advantage of $BrF_3$ gas phase silicon etching and Parylene deposition to enable a low temperature fabrication process.

BRIEF DESCRIPTION OF THE DRAWINGS

These and other aspects will be described with reference to the drawings, in which.

DESCRIPTION OF THE PREFERRED EMBODIMENTS

Figure 1A:
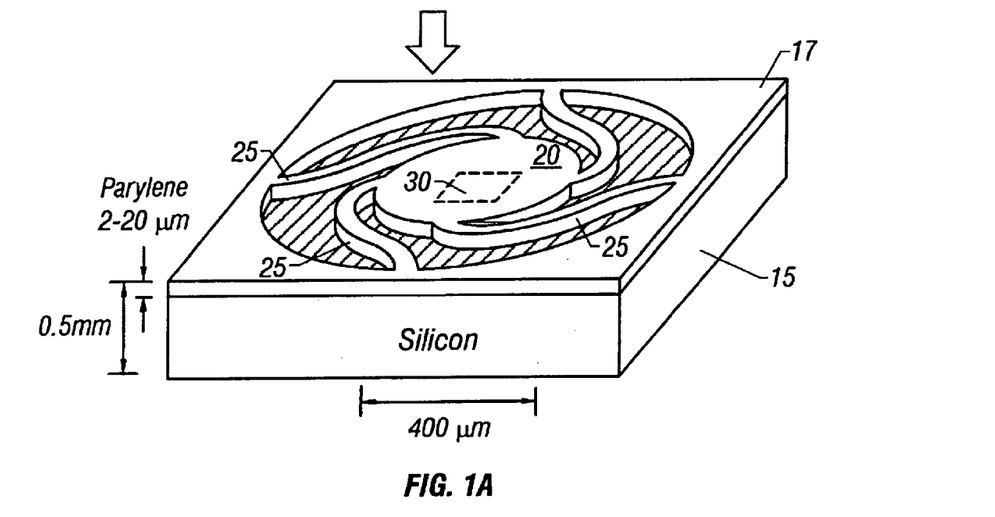
FIGS. 1A–1B shows a three-dimensional view of a micro check valve—in open and closed position—constructed with S-shaped twist-up tethers in accordance with the present disclosure.
Figure 1B:
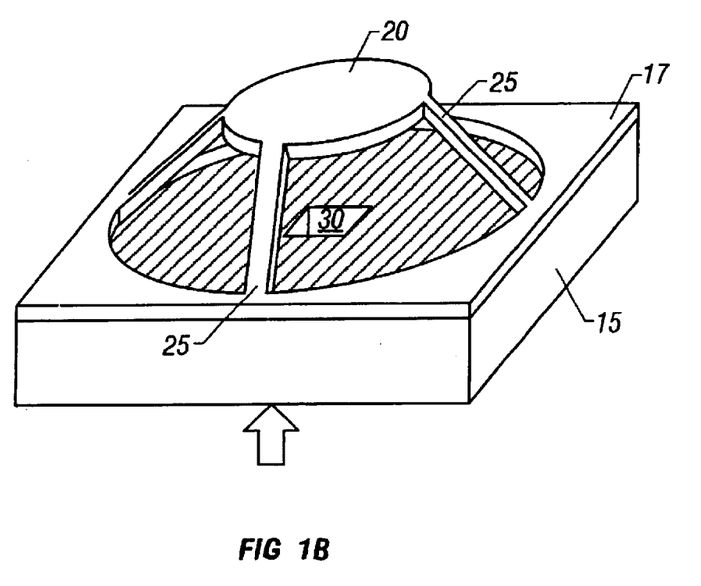
Figure 2:
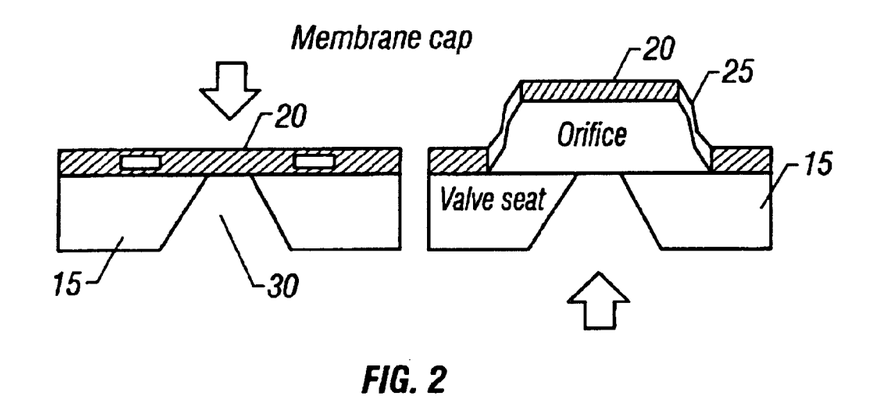
FIG. 2 shows a two-dimensional cross-sectional view of the micro check valve in FIG. 1.

Schematic illustrations and to view of a fabricated micro check valve 10 in accordance with a preferred embodiment is shown in FIGS. 1 and 2. The micro check valve 10 includes a bulk micromachined valve seat 15, preferably a silicon support substrate, to which a deflectable Parylene (TM) membrane 17 is anchored. Throughout this specification Parylene is used to describe a specific chemical in the poly-p-xylylene family. The deflectable membrane 17 includes a membrane cap 20 formed integral with S-shaped Parylene twist-up tethers 2S that self-align with respect to an orifice 30 formed in the valve seat 15.

While the illustrative embodiment is shown with four (4) circumferentially-orientated twist-up tethers, a fewer or greater number of tethers orientated in a number of different ways are also contemplated.

Under forward flow (valve open), the membrane cap 20 and twist-up tethers 25 rotate and twist up. Similarly, under reverse flow, the deflectable membrane 17 collapses, with the membrane cap sealing the orifice 30 and closing the valve.

The vertical displacement of the membrane cap 20 is a function of the length and shape of the tethers 25. Because Parylene has a very low Young's modulus (~2.8 GPa) and the thickness of the S-shaped twist-up tethers 25 is on the order of microns, the twist-up tethers 25 exert a very small resistance to the lift of the membrane cap 20. The twist-up tethers 25 provide negligible resistance to vertical displacement in response to fluid flow through the orifice 30 exerted against the membrane cap 20.

Micro check valve 10 exhibits low cracking pressure, high reverse pressure, low reverse flow leakage, and negligible membrane-induced flow resistance. The robustness of a tethered micro check valve coupled with the simple to manufacture, single-chip construction, makes this valve device very desirable and economical to manufacture.

Device Fabrication

The fabrication process of a polymer-based micro check valve 10 is shown in FIGS. 3A–3F.

Figure 3A:
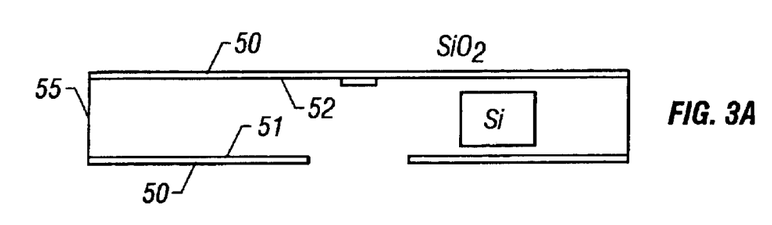
FIGS. 3A–3F shows the fabrication sequence of the micro check valve.
Figure 3B:
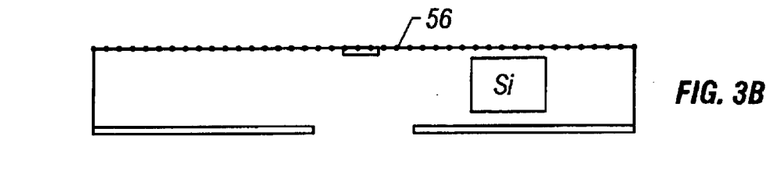

Initially, a 1.5-$\mu$m thick silicon dioxide layer 50 is thermally grown on both surfaces 51, 52 of a support substrate 55, preferably a silicon wafer, at 1,050° C. The silicon dioxide layer 50 on the bottom surface 51 of the wafer is patterned and etched by buffered hydrofluoric acid (BHF) to expose the silicon substrate (FIG. 3A). During this etching process, the opposite (top) surface 52 of the wafer is protected by a photoresist. The wafer is then immersed into potassium hydroxide (KOH). The KOH etches the top surface 52 until about a 20-$\mu$m thick membrane of silicon is left. Any residual silicon dioxide is removed from the top surface using BHF, followed by a 3-minute bromine trifluoride (BrF$_3$) gas phase etching to roughen the silicon substrate top surface 52. The roughened surface 56 is shown in FIG. 3B.

The wafer is then immersed into the 0.5% A-174 adhesion promoter for 20 minutes followed by a 15 to 30 second alcohol rinse. A 2-micron thick layer of a polymer material 58, preferably Parylene-C ("Parylene"), is deposited on only the top surface 52 of the wafer to form a first Parylene layer 58. The first Parylene layer 58 is then patterned using an oxygen plasma.

Figure 3C:
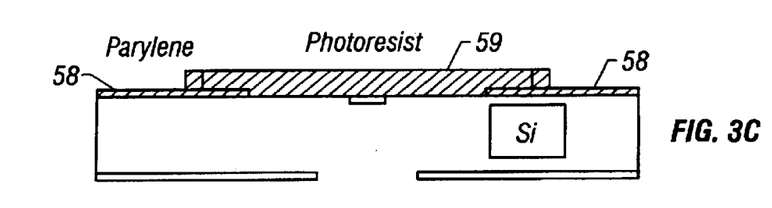

A 5-$\mu$m thick sacrificial photoresist (AZ4400) layer 59 is then spun and patterned over an exposed portion of roughened surface 56 and portions of the patterned first Parylene layer 58 (FIG. 3C). The wafer is then hard baked at 120° C. for 20 minutes to form smooth photoresist edges 60. The top of the wafer is then again etched in oxygen plasma (briefly) to clean and roughen the first Parylene layer 58 and photoresist layer 59 top surfaces.

Figure 3D:
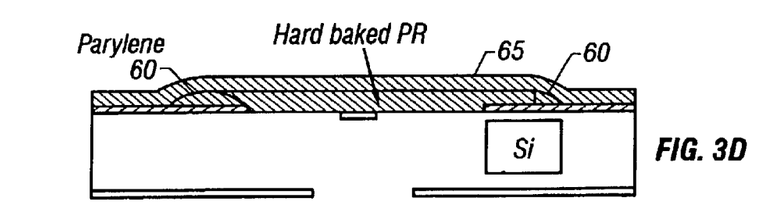
Figure 3E:
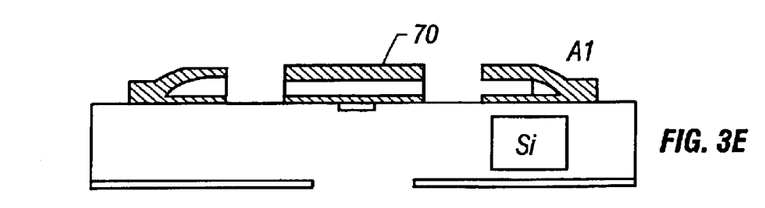

Once roughened, a second polymer layer 65 (also preferably a Parylene polymer layer) with a thickness of more than 2 $\mu$m is deposited over the top as shown in FIG. 3D. This is followed by a 0.1 $\mu$m thick layer of aluminum (Al) 70 formed by evaporation. The Al layer 70 is patterned and used as a mask to etch the second Parylene layer 65 with oxygen plasma (FIG. 3E).

Figure 3F:
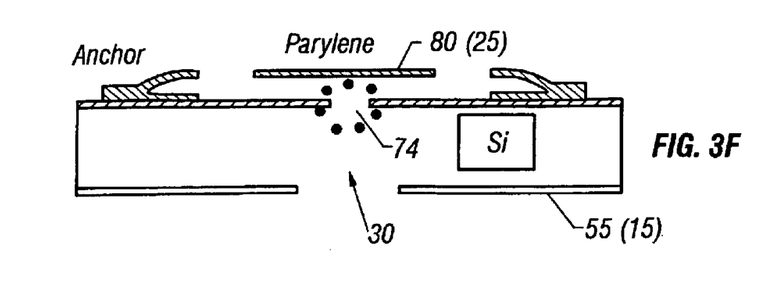

The silicon wafer is partially etched away at center portion 74, from underneath, using BrF$_3$. This exposes the sacrificial photoresist layer 59 and defines orifice 30. The wafer, which might include a plural number of micro check valves 10 fabricated all at the same time, is then diced. Photoresist etching in acetone (at room temperature) is then performed, followed by an alcohol and DI water rinse to remove any residual photoresist material (FIG. 3F). Upon completion, a micro check valve 10 as shown in FIG. 1 is thus formed.

The etching of the second Parylene layer is such as to form the S-shaped twist-up tethers 25 in such manner so they lay flat on the underlying roughened surface 56 of the support substrate when the valve is in the closed position, as shown in FIG. 1. The silicon support substrate constitutes the valve seat 15 of the micro check valve 10 The center portion 80 of the patterned second Parylene layer 65 constitutes the twist-up membrane cap 20 and rests, in a vertically displaceable manner, over the orifice 30.

Gas phase BrF$_3$ etching, used to roughen the surface 56, is found to significantly reduce stiction and surface tension in the valve by minimizing the contact area between mating surfaces. The roughened surface 56 also enhances adhesion of the Parylene anchors constituted by twist-up tethers 25. Exposure to gas phase BrF$_3$ under 1 Torr at room temperature generates ±2 $\mu$m of roughness on a polished silicon surface.

For forward valve fluid-flow, the robustness of the tether anchors 25 determine the maximum pressure the check valve may withstand. This robustness is greatly improved: (i) by the roughening of the substrate surface; (ii) by the depositing of a first Parylene layer which is patterned after applying A-174 adhesion promoter to the substrate surface 56 (this step is necessary because the A-174 adhesion promoter dissolves the photoresist sacrificial layer if used afterwards); and (iii) by reflowing and hard baking the sacrificial photoresist layer to smooth the photoresist edges 60.

Analysis of Orifice Flow

This section addresses the analysis of liquid and gas flows through the micro valve 10. Such analysis is important for fundamental understanding of valve operations generally, and is important for optimizing the micro check valve design for a specific application.

Figure 4:
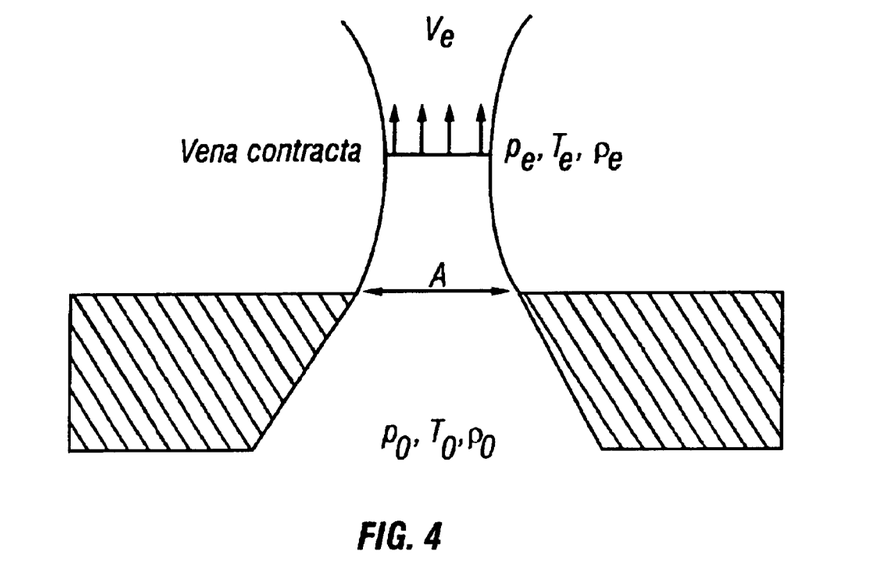
FIG. 4 is provided to graphically explain fluid flow principles through a micro orifice.

The flow across an orifice in the absence of the membrane cap, as illustrated in FIG. 4, is first considered. Due to a pressure difference, a jet discharges from a reservoir (with pressure $p_0$) through an orifice (with area / A) into the atmosphere (with pressure $p_{atm}$). Upon exiting the orifice the jet first contracts to a minimum region (called the vena contracta), achieving a velocity $v_e$. The jet then expands downstream. The area vena contracta is $A_e = \phi A$, where $\phi < 1$ is a contraction coefficient and A is the area of the orifice.

For an incompressible fluid such as water, $v_e = \sqrt{2\Delta p/\rho}$, where $\Delta p = p_0 - p_{atm}$ and $\rho$ is the fluid density. Here, we assume that $\phi = 0.61$, which holds for a slit orifice. Then, the volume flow rate can be calculated from $$Q = v_e A_e \qquad (1)$$

For a compressible fluid, the assumption of an isentropic flow leads to, $$v_e = \sqrt{[2\gamma R/(\gamma-1)][1-(p_e/p_0)^{(\gamma-1)/\gamma}]T_0}, \qquad (2)$$

where $T_0$ is the absolute temperature in the reservoir, $p_e$ is the fluid pressure at the vena contracta, R is the gas constant, and $\gamma$ is the ratio of the constant-pressure to constant-volume specific heats of the gas. The fluid density at the vena contracta is $$\rho_e = \rho_0 (p_e/p_0)^{1/\gamma}, \qquad (3)$$

where $\rho_0 = p_0/RT_0$ is the gas density in the reservoir. To estimate the contraction coefficient, the following formula can be used, $$\phi = \frac{\pi}{\pi + 2(p_e/p_0)^{1/\gamma}}. \quad (4)$$

Although this expression only holds for a slit orifice, it yields a reasonable estimation in the case of a circular orifice. Finally, the mass flow rate is given by $$m = \rho_e v_e A_e. \quad (5)$$

$p_e$ can next be determined from the following. It can be shown that $p_e=p_{atm}$ when $p_{atm}/p_{0>}>\lambda^\bullet=(2/(\gamma+1))^{\gamma/(\gamma-1)}$, and $p_e=\lambda^\bullet p_0$ when $p_{atm}/p_{0>}\leq\lambda^\bullet$. The phenomenon in the latter case is called choking, where the jet velocity reaches the speed of sound (i.e., the Mach number equals unity), and the mass flow rate becomes linear with the absolute reservoir pressure.

In the presence of the membrane cap, the above analysis ceases to hold, unless the displacement of the cap from the orifice is sufficiently large. In this case the ambient pressure will still equal the atmospheric pressure, and the bare-orifice analysis may be used. Testing shows that a tethered membrane cap introduces negligible flow resistance, and the preceding equations can be used to fit the experimental data. This will be demonstrated in the next section.

Performance Characterization

Tests were carried out to characterize structural rigidity and valve robustness of the micro check valve 10. The first test involved investigation of cracking pressure for the valve. Theoretically, the cracking pressure is a threshold value such that any applied pressure difference that is greater than this value will generate a flow rate. In practice, measured cracking pressures generally differ because of variations in measurement instrument sensitivities. For the illustrative-embodiment micro check valve, a nitrogen flow is detected at a pressure reading of 0.5 kPa, which is also the sensitivity of the pressure measurement. It follows that the cracking pressure is less than 0.5 kPa for gases. However, when wetted prior to the testing, the valve was found to have a cracking pressure of 1 kPa (±0.5 kPa). In a comparison with a smooth valve seat, a cracking pressure higher than 620 kPa was indicated. It can hence be concluded that the roughened top surface of the valve seat drastically reduces stiction and surface tension effects, and consequently lowers the cracking pressure.

A test was also performed to evaluate high reverse pressure and low reverse leakage characteristics realized with a tether valve configuration. For orifice sizes up to 370×370 $\mu m^2$ and a membrane thickness of 8 $\mu m$, the valve was found to withstand 600 kPa of reverse pressure without any structural damage. The valve showed very low leakage under such reverse flow conditions. For valve orifice sizes in the range of 60×60 $\mu m^2$ to 980×980 $\mu m^2$, no leakage of nitrogen was detected, using a flow meter with a resolution of 0.2 ml/min, under reverse pressure up to 100 kPa.

Figure 5:
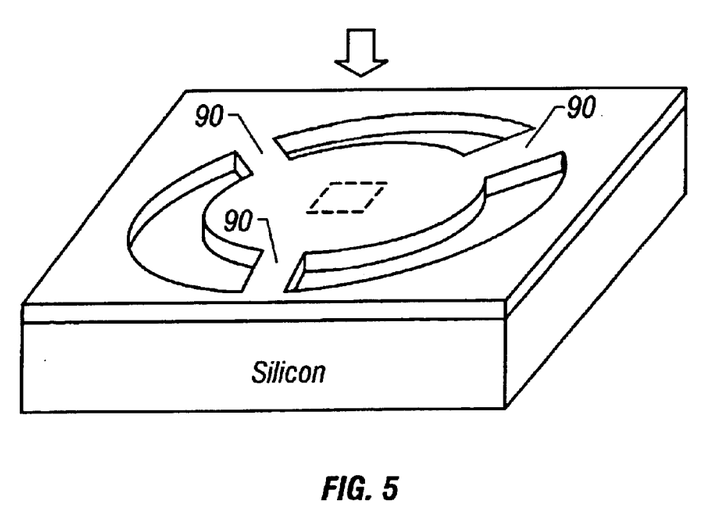
FIG. 5 shows a micro check valve construction with straight-arm tethers.
Figure 6:
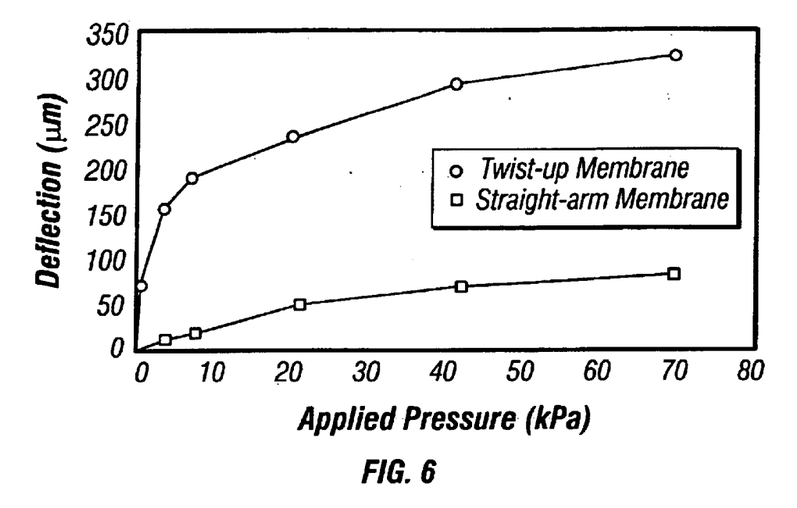
FIG. 6 is a graph comparing membrane deflection properties between twist-up tether and straight-arm tether configurations.

Tests were also performed to measure membrane deflection and its implication on membrane-induced flow resistance. The membrane cap under test was anchored by four twist-up tethers (arms) as shown in the illustrative embodiment of FIG. 1. Results were compared to an experimental valve configuration comprised of a membrane cap anchored by three (3) straight arms 90, as shown in FIG. 5. The load deflection data of the two valves is shown in FIG. 6. It can be seen that deflection of the twist-up membrane is roughly four times as large as that of the straight-arm anchored membrane. Thus the twist-up tether design is advantageous because large membrane deflections generally allow a larger flow rate for a given pressure difference. This is further demonstrated by the following testing data.

Figure 7:
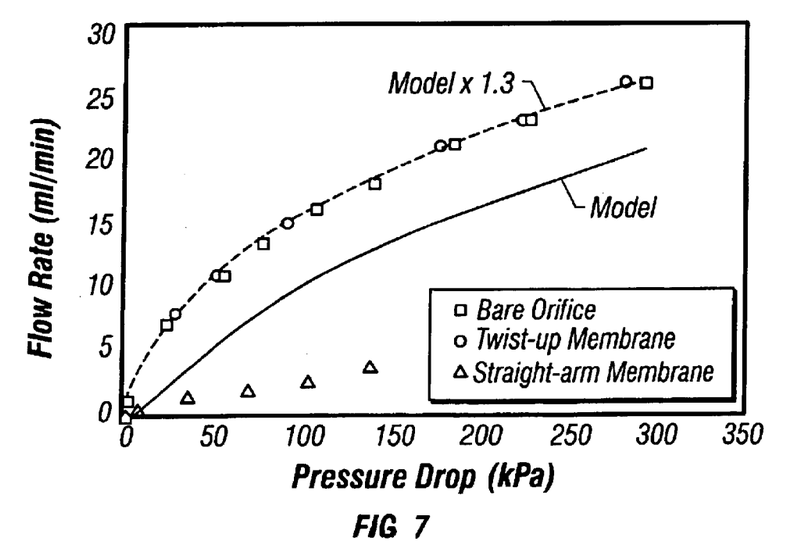
FIG. 7 is a graph of water flow characteristics in a valve with a 150 micron orifice.
Figure 8:
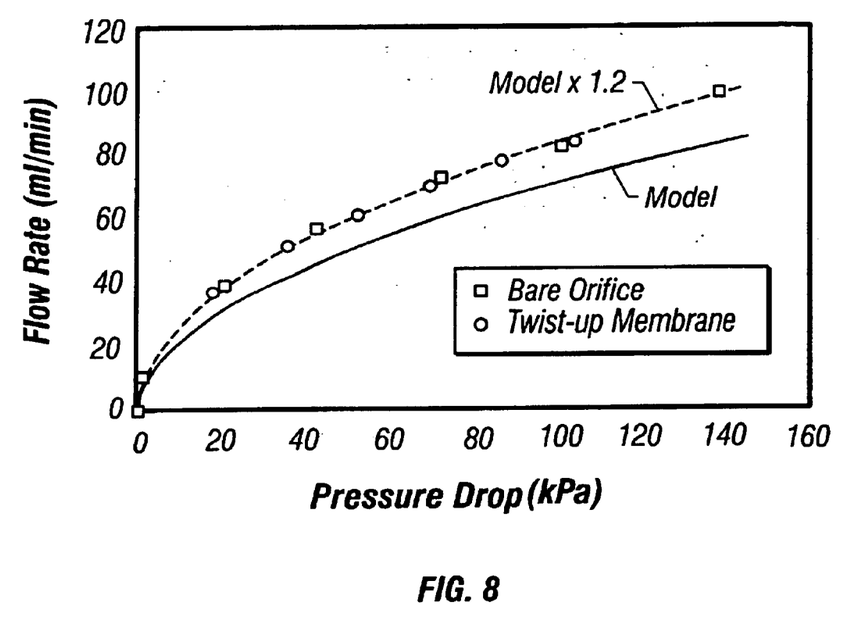
FIG. 8 is a graph of water flow characteristics in a valve with a 370 micron orifice.
Figure 9:
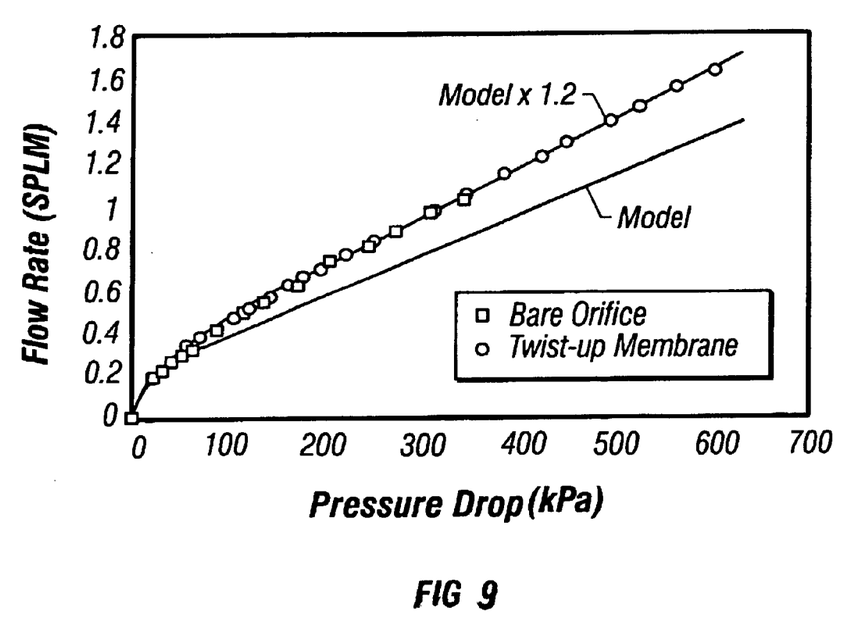
FIG. 9 is a further graph of nitrogen flow characteristics in a valve with a 150 micron orifice.
Figure 10:
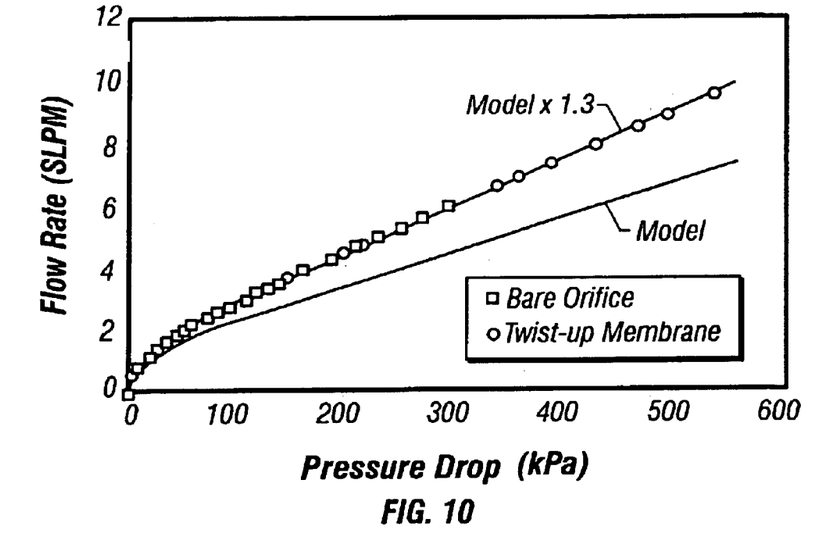
FIG. 10 is a yet further graph of nitrogen flow characteristics in a valve with a 370 micron orifice.

The measured flow rate is plotted as a function of applied pressure difference for water flow (FIGS. 7 and 8) and nitrogen flow (FIGS. 9 and 10). Two orifice sizes were (FIGS. 8 and 10). Measurements are performed on a bare orifice (plotted in squares), as well as on an orifice with a twist-up tethered membrane (plotted with diamonds). It can be seen that for a given pressure difference, there is no appreciable difference in the flow rate with or without the membrane. In other words, the membrane induced no significant resistance compared with that caused by the orifice itself for both water and nitrogen flows. As mentioned in the analysis section, this phenomenon is due to the fact that the membrane is deflected a sufficient distance away from the valve seat such that the pressure at the orifice exit remains close to the atmospheric pressure. In the valve design of FIG. 5 having a straight-arm tethered membrane, the flow rate in the presence of the membrane, as shown with triangles in FIG. 7, is considerably smaller than the bare orifice data. From this can be deduced that the relatively large stiffness of the straight-arm tethers resulted in significant flow resistance by the membrane. We also conclude that the check valve with a twist-up membrane can be treated the same as the bare orifice in analytical analysis.

The fluid flow models presented in the analysis section are examined here with respect to the experimental data. In FIGS. 7–10 are the theoretical predictions of flow characteristics (solid curves). Compared with experimental results, it can be seen that the models correctly predict the trend of flow characteristics. Quantitatively, the models give a flow rate that is smaller than actually measured (off by 20–30%).

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. A method of forming a micro check valve comprising:

etching a support substrate to form a valve seat having a top surface;

forming an orifice in the support substrate dimensioned to direct flow of fluid out from the top surface of the valve seat;

depositing a first polymer layer over the top surface of the valve seat covering said orifice;

patterning the first polymer layer;

depositing a second polymer layer over the patterned first polymer layer; and patterning the second polymer layer to form, along with the first polymer layer, a deflectable membrane, said deflectable membrane including a membrane cap anchored by a plurality of S-shaped twist-up tethers, the membrane cap being vertically displaceable from the top surface in response to fluid flow through the orifice.

2. The method of claim 1, wherein at least one of the first and second polymer layers is a para-xylene layer.

3. The method of claim 2, wherein the twist-up tethers are circumferentially orientated around the membrane cap and sized to sit flat on the top surface when the micro check valve is in the closed position.

4. The method of claim 3, wherein the first and second polymer layers are formed to a thickness of approximately 2 microns.

5. The method of claim 1, wherein the twist-up tethers are circumferentially orientated around the membrane cap and sized to sit flat on the top surface when the micro check valve is in the closed position.

6. The method of claim 1, further comprising roughening the top surface of the valve seat prior to depositing the first polymer layer.

7. The method of claim 6, wherein the roughening of the top surface involves gas phase etching using bromine trifluoride (BrF3).

8. The method of claim 1, further comprising depositing a photoresist layer over the patterned first polymer layer and prior to depositing the second polymer layer.

9. The method of claim 8, wherein the patterning of the second polymer layer involves depositing a mask layer over the second polymer layer and using an oxygen plasma to define the membrane cap and twist-up tethers.

10. The method of claim 1, wherein the first and second polymer layers are formed to a thickness of approximately 2 microns.

* * * * *